United States Patent [19]

Burke et al.

[11] 4,362,986

[45] Dec. 7, 1982

[54] METHOD AND MEANS FOR MONITORING FAULTS IN AN ELECTRIC POWER SYSTEM AND THE LIKE

[75] Inventors: James J. Burke, Ballston Spa; Dale A. Douglass; Robert A. Lacy, both of Scotia; Richard J. Murphy, Clifton Park; Delano D. Wilson, Scotia; Jonathan B. Wright, Schenectady, all of N.Y.

[73] Assignee: Electric Power Research Institute, Inc., Palo Alto, Calif.

[21] Appl. No.: 196,760

[22] Filed: Oct. 14, 1980

[51] Int. Cl.³ .............................................. G01R 31/02
[52] U.S. Cl. ...................................... 324/51; 324/113
[58] Field of Search .......................... 324/51, 113, 102

[56] References Cited

U.S. PATENT DOCUMENTS

| | | | |
|---|---|---|---|
| 3,401,395 | 9/1968 | Neher | 324/113 X |
| 3,729,654 | 4/1973 | Yeager | 324/51 X |
| 3,869,667 | 3/1975 | Canicatti | 324/113 |
| 3,889,289 | 6/1975 | Kubach | 324/113 X |
| 4,110,684 | 8/1978 | Gale | 324/102 X |
| 4,311,960 | 1/1982 | Barr | 324/113 X |

OTHER PUBLICATIONS

Smith et al., New Field Laboratories for the Measurement of Electrical Transients, International Conference on Large High Voltage Electric Systems, Aug. 27–Sep. 4, 1980 Session, pp. 1-12.

Douglas et al., Analysis of Fault Characteristics for Utility Distribution Systems, PTI Newsletter, Jul. 1979, pp. 1 & 3.

Fault Current Analysis, EPRI Journal, Jun. 1980, p. 57.

Fault Current Analysis, EPRI Journal, Jan./Feb. 1979, p. 47.

Primary Examiner—Stanley T. Krawczewicz
Attorney, Agent, or Firm—Flehr, Hohbach, Test, Albritton & Herbert

[57] ABSTRACT

A selected point in an electric power system is monitored for subsequent fault analysis. The voltage and current at the point is continuously sampled with samples for a predetermined period of time being temporarily stored in memory. In response to a Fault Event, voltage and current samples at differing sample rates and for differing periods of time are recorded. Voltage and current samples after a Cold Load Pickup are recorded, also the recorded samples allow later analysis of the fault and identification of the cause of the fault.

10 Claims, 8 Drawing Figures

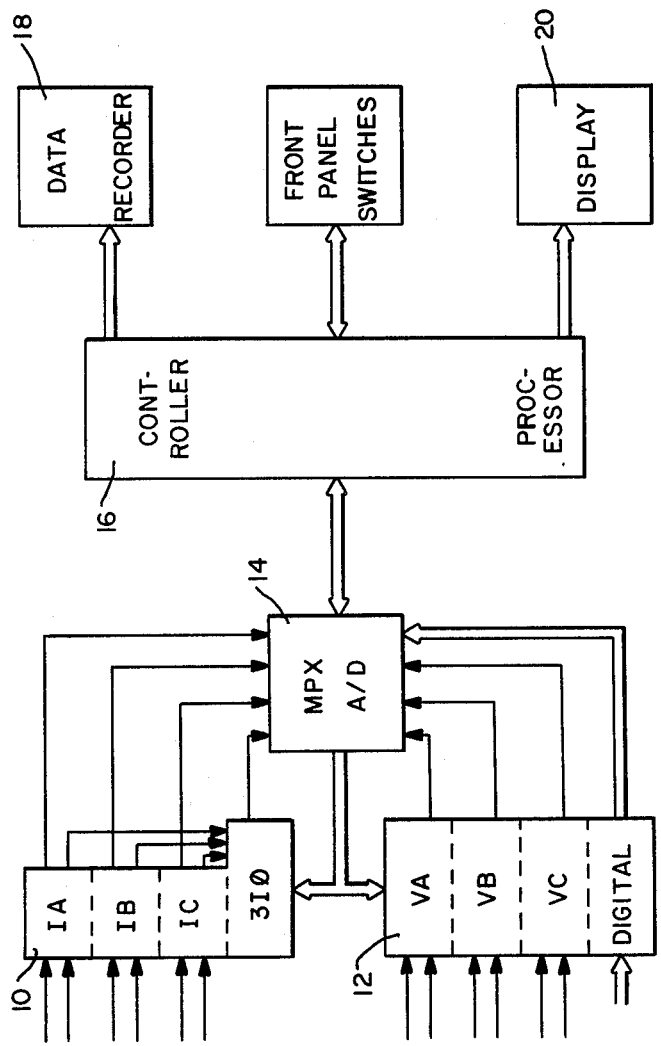
FIG.—1
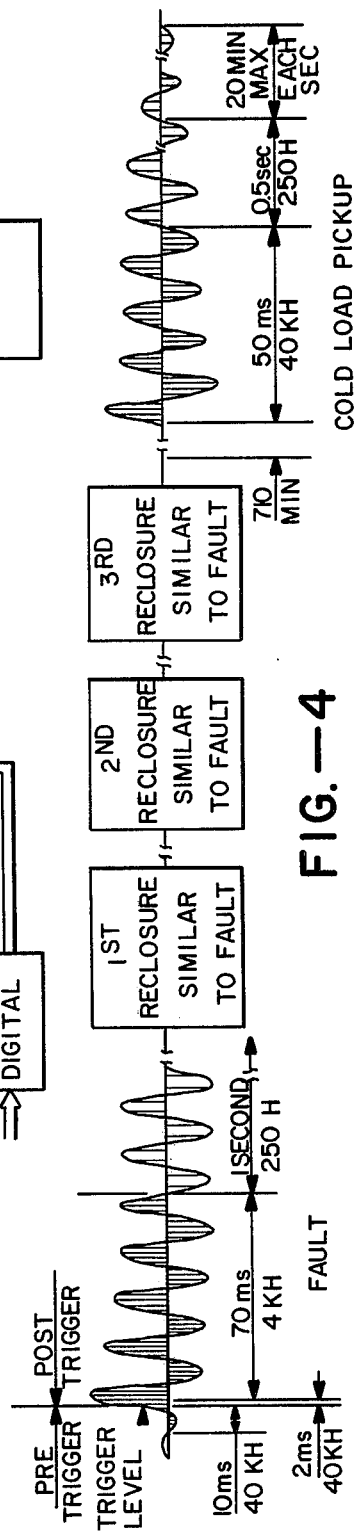
FIG.—4

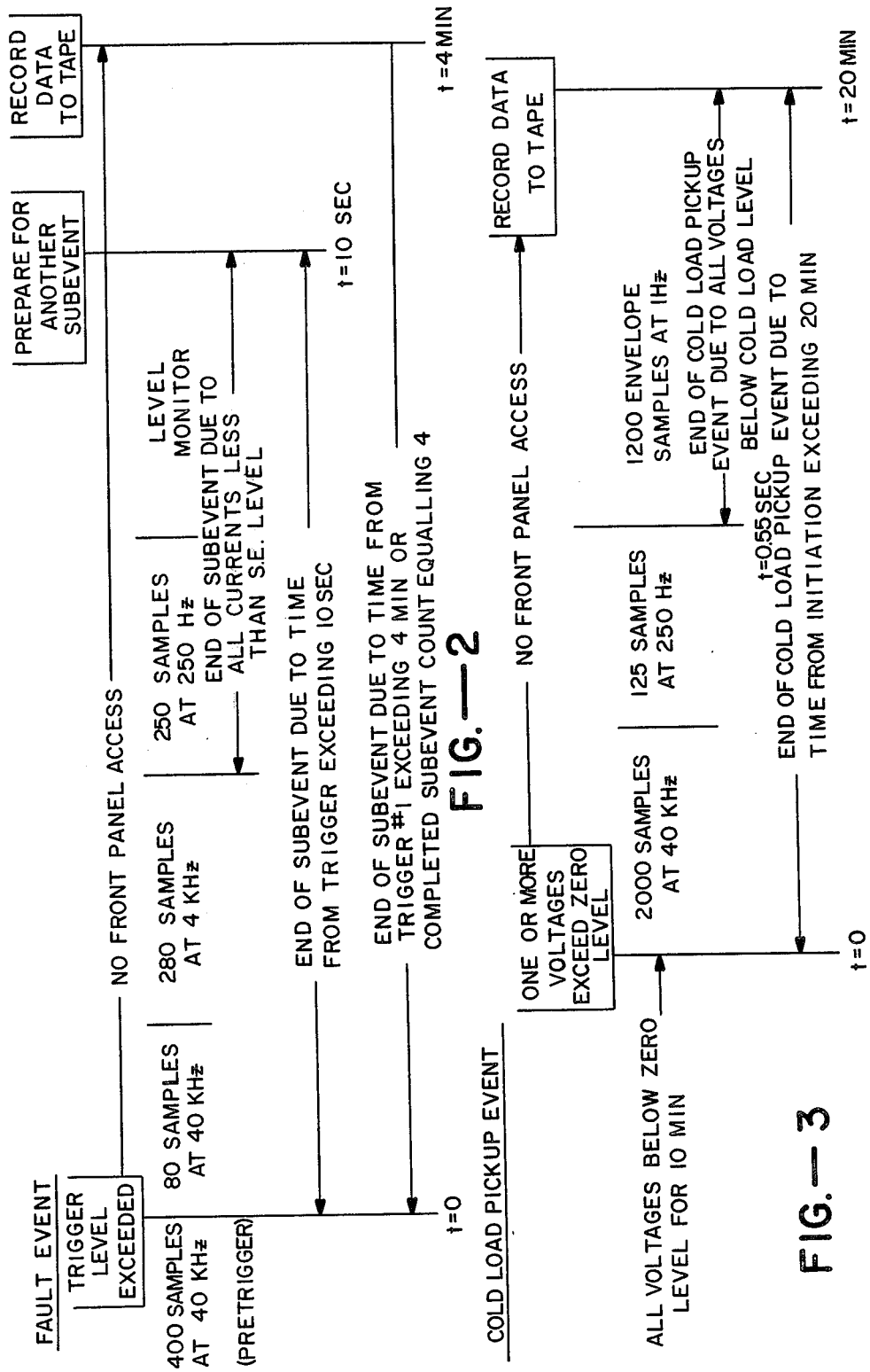
FIG.—2
FIG.—3

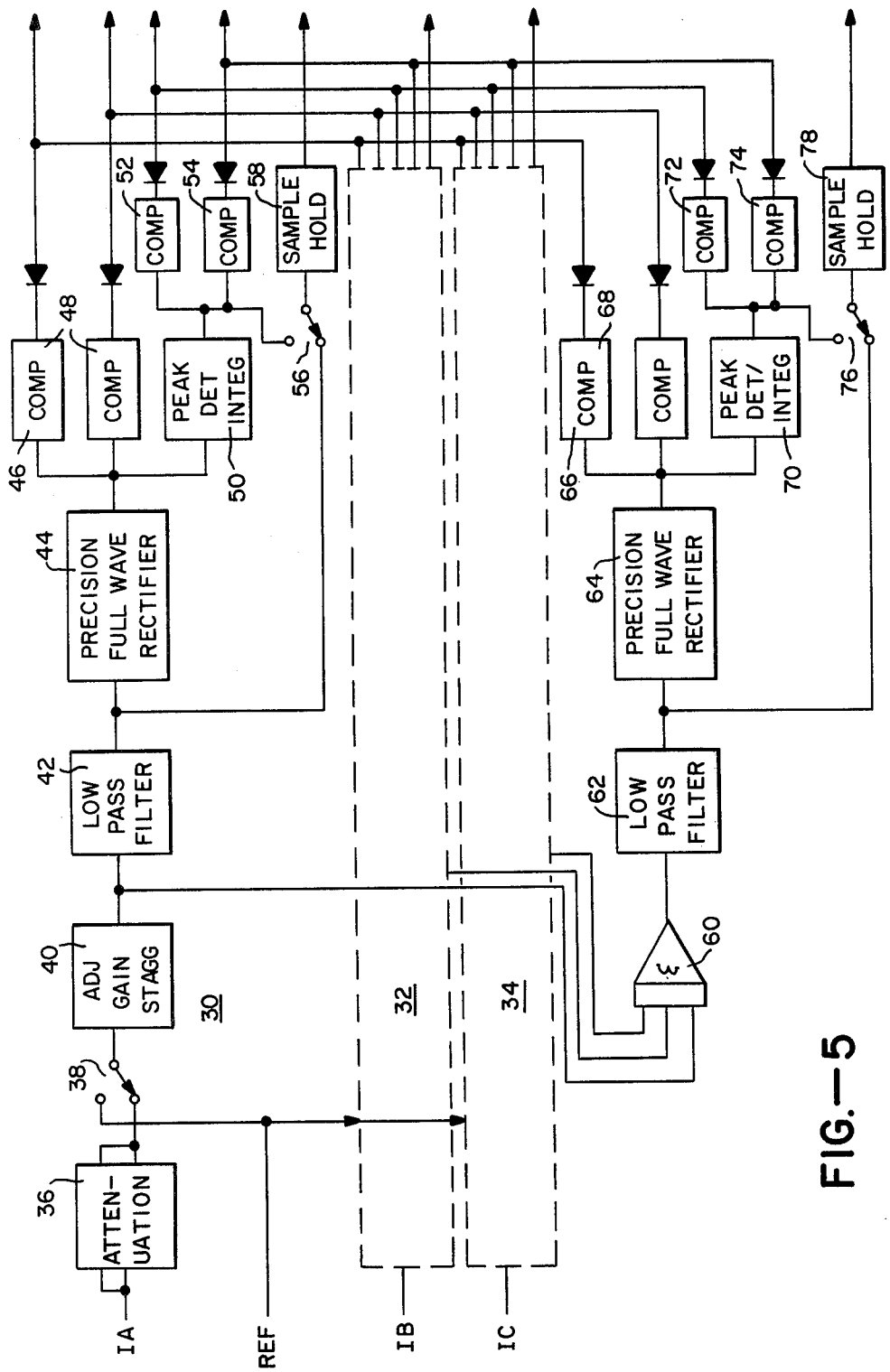
FIG.—5

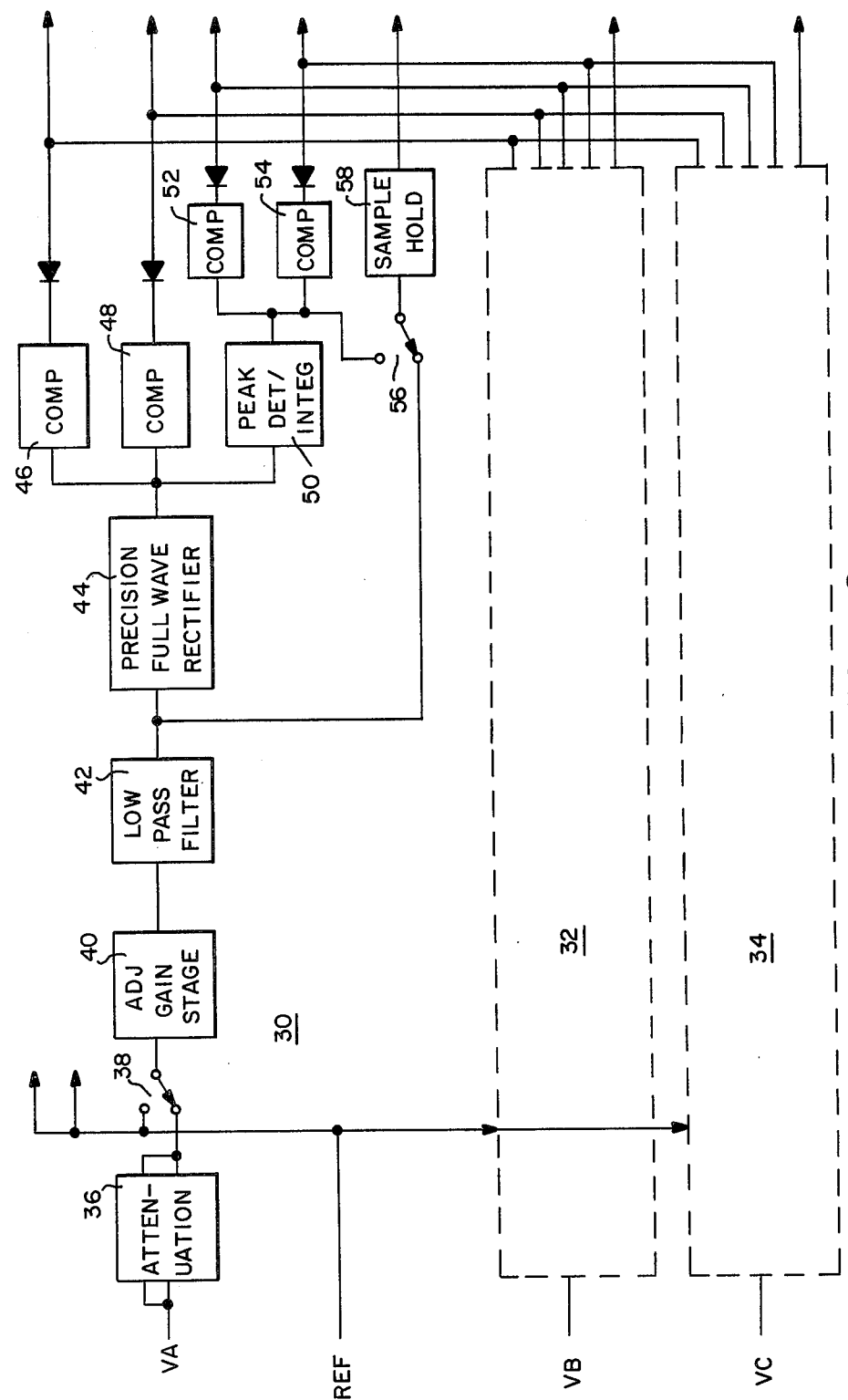
FIG.—6

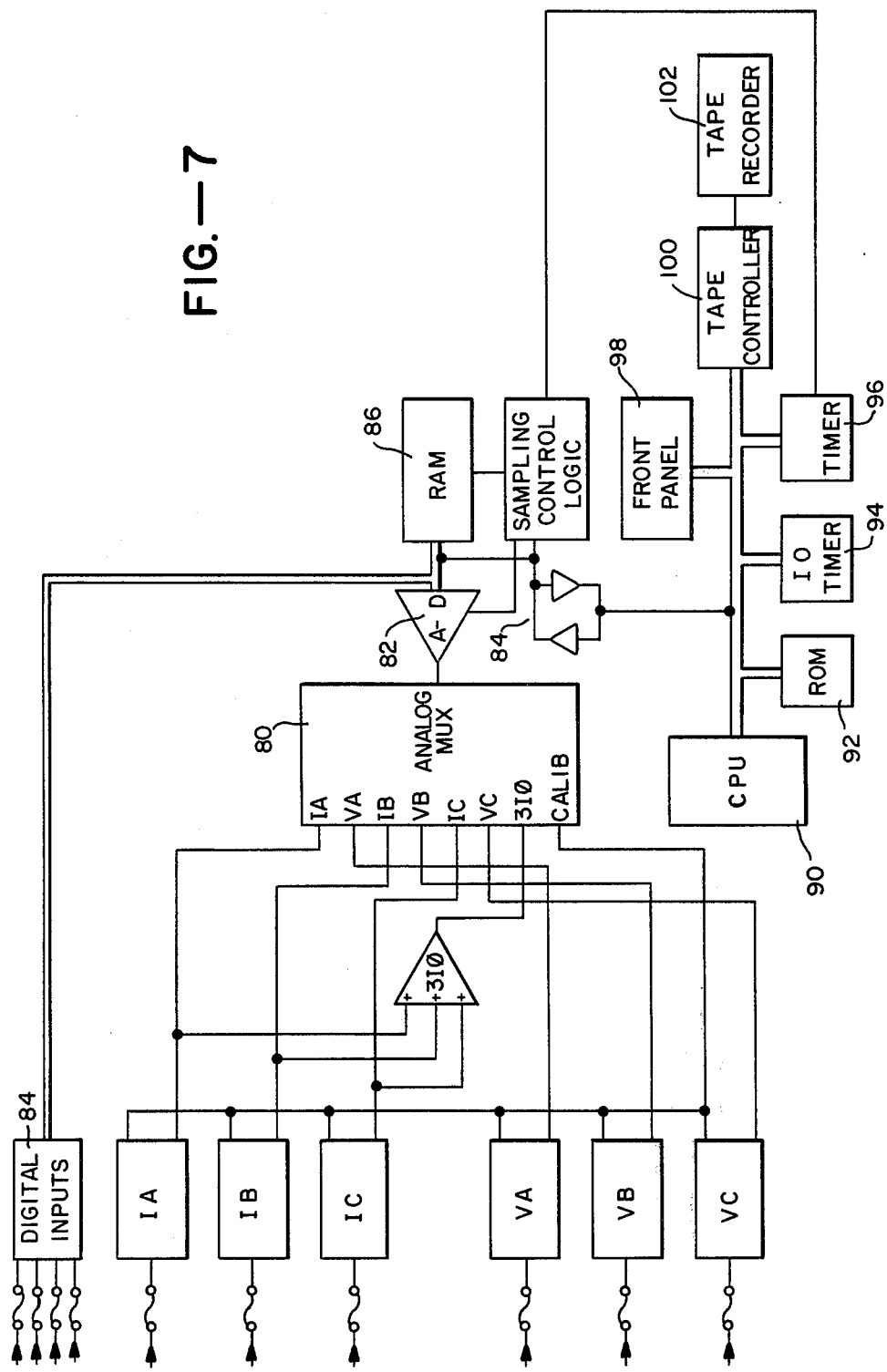
FIG.—7

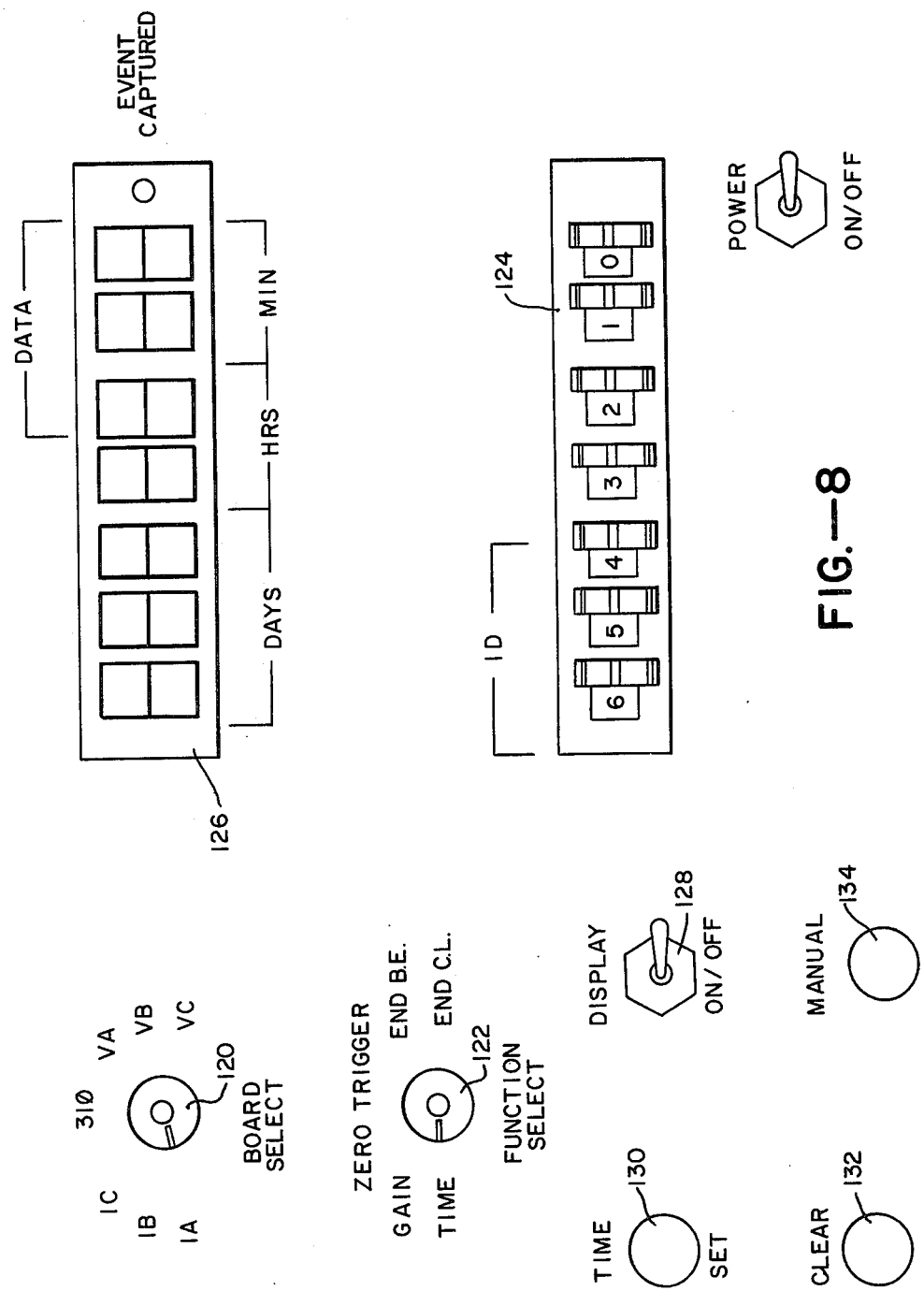
FIG.—8

METHOD AND MEANS FOR MONITORING FAULTS IN AN ELECTRIC POWER SYSTEM AND THE LIKE

This invention relates generally to electronic recording and data acquisition systems, and more particularly the invention relates to apparatus for monitoring an electric power system and recording current and voltage during system faults for subsequent analysis.

Magnitudes of fault currents experienced on utility electric power distribution systems are increasing as a result of increasing load densities and the use of high capacity distribution substations and substation transformers, higher primary distribution voltages, and lower impedance primary distribution circuits to supply the higher density loads.

The electric power industry spends substantial sums of money annually on new protective equipment to serve expected load growth and new equipment made necessary because of increasing fault current duty.

The theoretical maximum magnitude of the fault current that can be experienced at any location on a distribution system can be calculated. However, it is known that a large percentage of the fault currents actually experienced are much less than the theoretical maximum values.

In order to guide electric utilities in distribution equipment application practices and equipment manufacturing in developing optimum designs for primary distribution equipment that will ensure satisfactory performance under fault conditions at minimum cost, comprehensive information is needed regarding the statistical distribution of the magnitudes and characteristics of the fault current and voltages actually experienced. Heretofore, appropriate data relating to faults and electric power systems has not been adequate for this purpose.

Accordingly, an object of the present invention is a method of monitoring an electric power system and recording fault currents and voltages for subsequent fault analysis.

Another object of the invention is apparatus for monitoring voltage and current in electric power systems and recording fault current and voltage for subsequent analysis.

A feature of the invention is the sampling of fault currents and voltages for preselected periods of times at several sampling rates whereby subsequent analysis of the fault currents and voltages is enhanced.

Briefly, in accordance with the invention, apparatus for monitoring and recording voltage and current in an electric power system for subsequent fault analysis includes means for monitoring the voltage and current in a selected point in the system such as at a breaker in a substation. Means is provided for identifying voltage and current above preselected values and for recording the voltage and current values at a plurality of sampling rates for predetermined periods of times subsequent to the voltage and current exceeding the preselected values. In addition, means is provided for recording the voltage and current values at a plurality of sampling rates for a predetermined period of time subsequent to the re-establishment of voltage and current after a fault interruption thereof. Further, means is provided for recording the voltage and current values at a plurality of sampling rates for predetermined periods of times subsequent to current exceeding a zero level following a pre-established period of zero level current.

In a polyphase electric power system the means for monitoring voltage and current and recording the voltage and current is provided for each phase and for the cumulative current of all phases.

In a preferred embodiment, each voltage and current monitor means includes means for generating an electrical signal indicative of the voltage and current being monitored, attenuation and amplification means for receiving the signal and adjusting the magnitude thereof, and low pass filter means for receiving and filtering the signal from the attenuation and amplification means. Rectification means receives and rectifies the filter signal. A first comparator means receives the rectified signal and identifies a zero current condition. A second comparator means identifies a current above a preselected value, and an integrator means establishes a magnitude of the voltage and current being monitored.

The means for recording voltage and current values includes an analog to digital converter for receiving the analog signals from the current and voltage monitoring means and converting the analog signals to digital signals. Processor means responsive to the digital signals samples the digital signals and records the magnitude thereof in accordance with the predetermined sampling rates and predetermined times.

The invention and objects and features thereof will be more fully understood from the following detailed description and appended claims when taken with the drawings, in which:

FIG. 1 is a functional block diagram of apparatus for monitoring and recording voltage and current in accordance with the present invention.

FIG. 2 is an illustration of a fault event record in accordance with one application of the present invention.

FIG. 3 is an illustration of a cold load pickup event record in accordance with another application of the invention.

FIG. 4 is an illustration of signals for fault events and cold load pickup as defined in FIGS. 2 and 3.

FIG. 5 is a more detailed block diagram of current monitoring apparatus in accordance with one embodiment of the present invention.

FIG. 6 is a more detailed block diagram of voltage monitoring apparatus in accordance with one embodiment of the invention.

FIG. 7 is a more detailed block diagram of processing and recording apparatus in accordance with one embodiment of the invention.

FIG. 8 is a plan view of manual switches on one embodiment of the apparatus in accordance with the invention.

Referring now to the drawings, FIG. 1 is a functional block diagram of monitoring and recording apparatus for use in an electric power system for fault analysis in accordance with the invention. The illustrated block diagram is for a three phase system (phases A, B, C), and the currents in all phases are monitored individually and cumulatively while the voltages are monitored individually. In addition, a fault responsive component such as a circuit breaker can be monitored for its effective opening and closing in response to the fault.

Three channels are provided for current monitoring, Channel IA, Channel IB, and channel IC. In addition, any current imbalance in the three phase system is monitored by the cumulative current, Channel $3I\phi$. The cumulative current or phase imbalance can be monitored by detecting the current in the three phase neutral line.

The voltage in each phase is monitored by a voltage Channel $V_A$, voltage Channel $V_B$, and voltage Channel $V_C$. In addition, operation of the circuit breaker or other system component is monitored through the DIGITAL channel.

The analog signals from the current channels shown generally at 10 and the analog signals from the voltage channels shown generally at 12 are applied to an analog to digital converter and multiplexer 14. Alternatively, each channel can be provided with an analog to digital converter with the digital signals then applied to a multiplexer. The digital information from the multiplexer is then applied to a processor 16 which controls the monitoring function and effects the recording of data on a recorder 18 and the display of data on a segment display 20. Processor 16 can be a hard wired control circuit. However, in the preferred embodiment a programmed microprocessor such as the INTEL 8085 is employed for controlling the monitoring of the system parameters and the recording and display of data. A front panel 22 allows for calibration of the apparatus, as will be described further hereinbelow.

In the preferred embodiment the apparatus has two separate sampling sequences, a FAULT EVENT and a COLD LOAD PICKUP. These two operation modes are described in FIGS. 2 and 3 and illustrated in FIG. 4. The FAULT EVENT is triggered by the monitored parameter (current or voltage) exceeding a preset level. Thereupon, ten milliseconds of data prior to the trigger point are recorded at 40 kilohertz sample rate (400 samples), 2 milliseconds of data subsequent to the trigger are recorded at 40 kilohertz sample (80 samples), 70 milliseconds of data are recorded at 4 kilohertz sample rate (280 samples), and 1 second of data is recorded at a 250 hertz sample rate (250 samples). This sampling and recording is effected for each channel and for each reclosure.

The second recording sequence, COLD LOAD PICK-UP, is effected after the monitored system has been de-energized with all voltages at zero level for at least ten minutes. The apparatus is triggered when the power network is re-energized, and the sample sequence for the cold load consists of 15 milliseconds of data at 40 kilohertz sample rate (2,000 samples) followed by one-half second of data at 250 hertz sample rate (125 samples) and 20 minutes of data at one sample per second (1,200 samples). The latter samples provide the magnitude of current and voltage and give an envelope of the load profile.

Based upon the recorded information, harmonic content of currents and voltages during a FAULT EVENT can be determined along with a ratio of the fault voltage and current to normal voltages and current. An analysis of the symmetrical and asymmetrical amperes during the fault can be made and the fault clearing time can be determined. Further, the recorded data will indicate the coordination of the protective devices on the network.

From the closing transients in the COLD LOAD PICKUP, the following information and analysis can be determined for each closing event:
1. Peak transient current and voltage
2. Transient frequency
3. Peak 60 hertz current
4. Time constant of cold load current decay
5. Cold load current
6. Duration of load interruption prior to pickup In addition, the following correlations can be established:
1. Percent cold load current with interruption duration
2. Decay time constant with interruption duration Referring now to FIGS. 5 and 6, the input section for one embodiment of the apparatus is illustrated. In FIG. 5 an input signal derived from each phase current is applied to each of the channels 30, 32, and 34. Channels 32 and 34 are identical to Channel 30 and are not illustrated in further detail. In Channel 30 the input signal, $I_A$ is applied through an attenuator 36 and an analog switch 38 which switches between the attenuated signal and a reference voltage for calibration purposes. The signal from switch 38 is then passed to an adjustable gain amplifier 40 with the gain of the amplifier periodically adjusted based on the reference voltage. The signal from amplifier 40 is then passed through a 10 kilohertz low pass filter and the filtered signal is then rectified by full wave precision rectifier 44. The output from the full wave rectifier 44 is applied to a first comparator 46 which compares the signal to a zero current value to determine initiation of COLD LOAD PICKUP. The output from the full wave rectifier 44 is applied also to a second comparator 48 which compares the current to a preset trigger level for initiation of a FAULT EVENT. The full wave rectifier signal is also applied to a peak detector and integrator 50 with the output of the integrator applied to a first comparator 52 for determining the end of a FAULT EVENT, a second comparator 54 for determining the end of a COLD LOAD EVENT, and through switch 56 to a sample and hold circuit 58. Switch 56 can also select a voltage from the low pass filter 42 for application to the sample and hold circuit 58. Thus, switch 56 permits monitoring of either the peak detector or the input signal at the output of the low pass filter.

A summing amplifier 60 is provided for receiving a signal from each channel after the adjustable gain stage 40 to determine the current asymmetry in the network. Similar to the channel for $I_A$, the output of summing amplifier 60 is applied to a low pass filter 62 with the filter output applied to full waved rectifier 64. The output of the full wave rectifier 64 is then applied to a first comparator 66, a second comparator 68, and the peak detector and integrator 70, similar to the comparators 46 and 48 and peak detector and integrator 50 in the $I_A$ channel. The output of the integrator 70 is then applied to a comparator 72, a second comparator 74, and to switch 76 to sample and hold circuit 78.

The voltage channels illustrated in FIG. 6 are similar to the current channels of FIG. 5 and the same reference numerals are used therein for corresponding components of the channels.

Referring now to FIG. 7, a functional block diagram of the processor portion of the apparatus is illustrated. The inputs from the three current channels plus the cumulative current channel along with the three voltage channels are applied to an eight input analog multiplexer 80. The multiplex signals are then applied through an analog to digital (A/D) converter 82 with the outputs from A/D converter 82 along with inputs from the input circuitry 84 for a monitored device (e.g. a switch) applied by the processor buffer 84 and dynamic ram memory 86. Buffer 84 interconnects the A/D converter 82 and memory 86 to the processor bus 88. In the preferred embodiment, an Intel 8085 system is utilized. Connected to bus 88 is an 8085 CPU 90, ROM 92 which includes the operating software, an I/O timer 94, a programmable timer 96, the front switches 98, and a tape controller 100 and tape recorder 102. Memory 86 is accessed from two sources; the sampling circuitry for each of the current and voltage channels when converted data is stored in the memory, and the microprocessor when data is written to or read from the memory. All data transferred from the A/D converter 82 and data transferred to and from memory is over the data bus. In one embodiment the A to D clock is set at 4 megahertz derived from a basic 20 megahertz oscillator.

The computer system is commercially available and the programming thereof for executing the FAULT EVENT and COLD LOAD PICKUP is conventional and is not considered part of the present invention. The currents and voltages are continually monitored at a 40 KHz sample rate with samples continually stored in memory for a 10 millisecond time period. Upon the occurrence of a fault trigger, the preceding 10 milliseconds of data (400 samples) are recorded along with the subsequent data at the sampling rates described hereinabove.

FIG. 8 is a view of a front panel of one embodiment and illustrates the switches available thereon for calibration and controlling the apparatus. Switch 120 selects the channels of calibration, and switch 122 selects the parameter for each channel to be set. Gain adjust, zero setting reference level, trigger setting reference level, the end of a fault event level, and the end of a cold load level can be set for each of the channels determined by switch 120. Thumb wheel switches 124 allow time to be incoded into the timer, and the inputted time can be read out on a display 126 which is actuated by display switch 128. Push button 130 allows incoded time to be set in the internal clock, push button 132 clears the internal clock, and push button 134 allows manual adjustment.

The event capture display shows that a fault event has been recorded on tape. The display on/off switch enables display of calibration parameters on the display in the calibration mode. The time select displays current real time on the display and allows a re-setting of time by means of the thumb wheel switches. The setting is loaded when the time set button is pushed.

The gain function selects the output of the peak detector on the channel selected by the board select switch and converts the level to a three digit word which is shown on the display. A Zero select establishes the trigger voltage level for each channel selected by the channel select switch and converts the level to a three digit word which is shown on the display.

The trigger function selects the trigger voltage level of the trigger level comparator on the board selected by the board select switch and converts the level to a three digit word which is shown on the display.

The end of sub event selects the voltage level on the end S.E. comparator on the channel selected by the channel select switch and converts the level to a three digit word which is shown on the display.

The end cold load selects the trigger voltage level of the end C.L. comparator on the channel selected by the channel select switch and converts the level to a three digit word which is shown on the display.

The Channel Select selects the board or channel to be calibrated when the function select switch is in any but the time position. The clear switch causes tape to rewind to the load position. This button can be used for loading new tape. The manual trigger causes a manual sampling and storage of data and a subsequent dump of the stored data onto tape for testing purposes.

Use of the monitoring and recording apparatus in accordance with the present invention makes available comprehensive statistical data on fault currents as they are actually experienced from primary distribution systems. Statistical data on cold load pickup currents is available through investigation of the current transients which occur when circuits are initially energized. While the invention has been described with reference to an illustrative embodiment, the description is illustrative of the invention and not to be construed as limiting the invention. Various modifications and applications may occur to those skilled in the art without departing from the true spirit and scope of the invention as defined by the appended claims.

What is claimed is:

1. The method of monitoring an electric power system and recording faults for subsequent analysis comprising the steps of
    (a) monitoring voltage and current at a selected point in said system,
    (b) identifying voltage and current above preselected values,
    (c) recording voltage and current values at a plurality of sampling rates for a predetermined period of time subsequent to voltage and current exceeding said preselected values,
    (d) recording voltage and current values at a plurality of sampling rates for a predetermined period of time subsequent to the re-establishment of voltage and current after a fault interruption thereof, and
    (e) recording voltage and current values at a plurality of sampling rates and for predetermined periods of times subsequent to current exceeding a zero level following a preselected period of zero level current.

2. The method as defined by claim 1 wherein the recording of voltage and current in Step (c) and Step (d) is 2 milliseconds of data at 40 kilohertz sampling rate, 70 milliseconds of data at 4 kilohertz sampling rate, and 1 second of data at 250 hertz sampling rate.

3. The method as defined by claim 2 and further including the recording of data in Step (c) and in Step (d) for 10 milliseconds prior to voltage and current exceeding a preselected value and at 40 kilohertz sampling rate.

4. The method as defined by claim 1 or 3 wherein recording of voltage and current in Step (e) is 50 milliseconds of data at 40 kilohertz sampling rate, one-half second of data at 250 hertz sampling rate, and 20 minutes of data at 1 hertz sampling rate.

5. The method as defined by claim 4 wherein said electric power system is polyphase and the recording of voltage and current includes the recording of voltage and current for each phase and the current representing the cumulative value of current in all of said polyphases.

6. Apparatus for monitoring and recording voltage and current in an electric power system for subsequent fault analysis comprising
    (a) current monitoring means for measuring current at a selected point in said electric power system,
    (b) voltage monitoring means for measuring voltage at said selected point in said electric power system,
    (c) means for identifying measured voltage and current above preselected values, (d) means for recording voltage at a plurality of sampling rates for predetermined periods of time subsequent to voltage and current exceeding said preselected values, recording voltage and current values at a plurality of sampling rates for predetermined periods of time subsequent to the re-establishment of voltage and current after a fault interrupt thereof, and recording the voltage and current values at a plurality of sampling rates for predetermined periods of time subsequent to current exceeding a zero level following a predetermined period of zero level current.

7. Apparatus as defined by claim 6 wherein said electric power system is polyphase and said current monitoring means monitors current in each phase, said voltage monitoring means monitors voltage in each phase, and said means for recording voltage and current values records voltage and current values for each phase and for the cumulative current of all phases.

8. Apparatus as defined by claim 6 or 7 wherein said current monitoring means includes means for generating an electrical signal indicative of current, attenuation and amplification means for receiving said signal and adjusting the magnitude thereof, low pass filter means for receiving and filtering said electrical signal from said attenuation and amplification means, rectification means for receiving and rectifying said signal from said low pass filter, first comparator means for establishing a zero current condition, second comparator means for establishing a current above a preselected value, and integrator means for establishing a magnitude of current.

9. Apparatus as defined by claim 8 wherein said voltage monitor means includes means for generating electrical signals indicative of voltage, attenuation and amplification means for receiving said signal and adjusting the magnitude thereof, low pass filter means for receiving and filtering said signal from said attenuation amplification means, rectification means for receiving and rectifying said signal from said low pass filter, first comparator means for establishing a zero voltage condition, second comparator means for establishing a voltage above a preselected value, and integrator means for establishing a magnitude of voltage.

10. Apparatus as defined by claim 9 wherein said means for recording said voltage and current values includes analog to digital converter means for receiving said analog signals from said current monitor means and said voltage monitor means and converting said analog signals to digital signals recorder means, and processor means responsive to said digital signals for recording magnitudes thereof in accordance with said sampling rates and said predetermined time periods.

* * * * *